United States Patent [19]

Yonemoto et al.

[11] Patent Number: 4,875,100

[45] Date of Patent: Oct. 17, 1989

[54] ELECTRONIC SHUTTER FOR A CCD IMAGE SENSOR

[75] Inventors: Kazuya Yonemoto; Yoshiaki Kagawa; Kikue Ishikawa; Tomoyuki Suzuki; Masaharu Hamasaki, all of Kanagawa, Japan

[73] Assignee: Sony Corporation, Tokyo, Japan

[21] Appl. No.: 110,844

[22] Filed: Oct. 21, 1987

[30] Foreign Application Priority Data

Oct. 23, 1986 [JP] Japan ................................ 61-252375
Dec. 23, 1986 [JP] Japan ................................ 61-307474

[51] Int. Cl.$^4$ ............................................ H04N 5/335
[52] U.S. Cl. ............................ 358/213.19; 358/213.31
[58] Field of Search ..................... 358/213.19, 213.31, 358/213.11

[56] References Cited

U.S. PATENT DOCUMENTS

| | | | |
|---|---|---|---|
| 3,934,161 | 1/1976 | Caywood | 358/213.19 |
| 4,524,391 | 6/1985 | Nishizawa et al. | 358/212 |
| 4,605,862 | 8/1986 | Takeshita | 250/578 |
| 4,626,915 | 12/1986 | Takatsu | 358/213 |
| 4,626,916 | 12/1986 | Mizoguchi et al. | 358/213.12 |
| 4,636,865 | 1/1987 | Imai | 358/213 |
| 4,743,778 | 5/1988 | Takatsu et al. | 307/311 |
| 4,769,709 | 9/1988 | Van De Steeg | 358/213.19 |

OTHER PUBLICATIONS

1982 ISSCC Digest of Technical Paper, pp. 168-169, 314, "Interline CCD Image with an Anti Blooming Structure", Ishihara et al.

Primary Examiner—James J. Groody
Assistant Examiner—Robert M. Bauer
Attorney, Agent, or Firm—Hill, Van Santen, Steadman & Simpson

[57] ABSTRACT

A solid state imager device having an electronic shutter function suitable for use in a video camera or an electronic still camera to suppress brightness differences on TV screens between open and closed periods of the shutter having a semiconductor substrate of a first conductivity type, a region of second conductivity type formed on the semiconductivity substrate of the first conductivity type and a signal charge accumulating region formed on the surface side of the second conductivity type region wherein, a predetermined voltage is applied to the semiconductor substrate of the first conductivity type and the signal charges accumulated in the signal charge accumulating region are discharged to the semiconductor substrate of the first conductivity type, whereby, the exposure time of the solid state imager device can be controlled so that when this imager device is used, for example, in a video camera, the video camera does not have to be provided with a mechanical shutter.

2 Claims, 3 Drawing Sheets

ELECTRONIC SHUTTER FOR A CCD IMAGE SENSOR

BACKGROUND OF THE INVENTION

1. Field of the Invention

This invention relates generally to solid state imager devices and specifically to a solid state imager device having an electronic shutter function suitable for use in a video camera, an electronic still camera, etc.

2. Description of the Prior Art

It has been desired in the art that a solid state imager device be able to control its exposure time by electronic means provided therein so that when the solid state imager device is used in, for example, a video camera, the use of a mechanical shutter, which is common in the prior art, becomes unnecessary. Without a mechanical shutter, a video camera could be made small in size, light in weight and low in cost.

There has already been proposed in the art a solid state imager device which permits selection between two exposure times, one long and one short. This solid state imager device has one of the two exposure times chosen to be 1/30 second, which is equal to one frame period, and the other exposure time chosen to be about 1/2000 second, which is equal to a vertical blanking period.

In accordance with this solid state imager device, when the 1/30 second exposure time is selected, signal charges accumulated in the light receiving section during one frame period are read out as an image signal. On the other hand, when the 1/2000 second exposure time is selected, signal charges accumulated before a vertical blanking period are read out to the vertical register section and discharged by a high speed transfer while signal charges newly accumulated only for the vertical blanking period are read out as an image signal.

However, the above-discussed solid state imager device is limited in that it only allows selection between two exposure times so that, even when a video camera is equipped with such solid state imager device, the video camera still requires a mechanical shutter. Moreover, since a high speed transfer is required to discharge the signal charges accumulated before a vertical blanking period to the vertical register, the solid state imager device consumes excessive electric power.

SUMMARY OF THE INVENTION

The present invention provides a solid state imager device which is capable of controlling its exposure time to a desired value by electronic measure. Furthermore, the present invention provides a solid state imager device with reduced power consumption for the exposure time control.

To achieve the foregoing, the present invention provides a solid state imager device comprising a semiconductor substrate of a first conductivity type, a region of a second conductivity type formed on the semiconductor substrate of the first conductivity type and a signal charge accumulating region formed on the surface side of the second conductivity region. The solid state imager device is characterized by means for applying a predetermined voltage to the semiconductor substrate of the first conductivity type to thereby discharge signal charges accumulated in the signal charge accumulating region to the semiconductor substrate of the first conductivity type.

Therefore, an object of the invention is a solid state imager device capable of controlling the exposure time to a desired value and reducing the power consumption for the exposure time control. These and other objects, features and advantages of the present invention will become apparent from the following detailed description of the preferred embodiment taken in conjunction with the accompanying drawings.

DESCRIPTION OF THE PREFERRED EMBODIMENT

Figure 1:
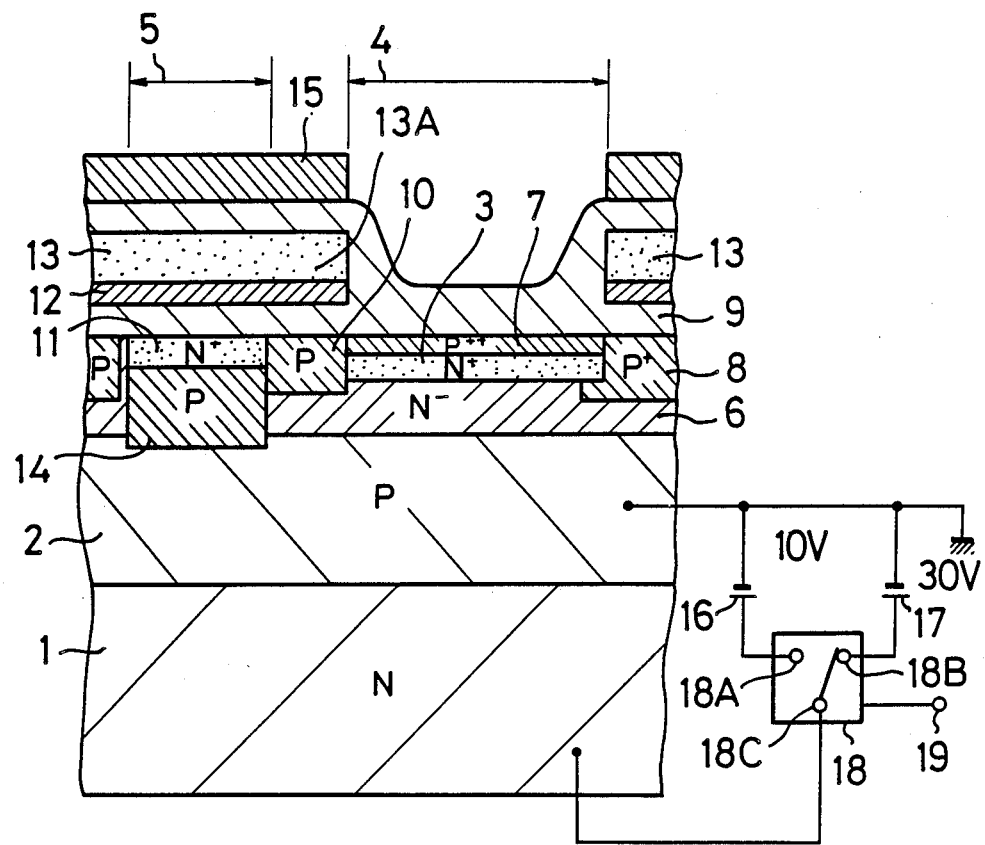
FIG. 1 is a cross-sectional view showing an embodiment of a solid state imager device according to the principles of the instant invention.
Figure 2:
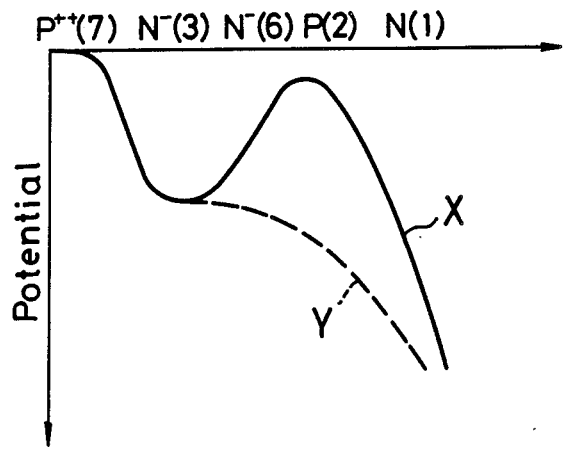
FIG. 2 is a graph showing the potentials of the solid state imager device shown in FIG. 1 at its respective regions in the depth direction thereof.

With reference to FIGS. 1 through 3, an embodiment of a solid state imager device according to the present invention will be described. In this embodiment, the present invention is applied to a solid state imager device which employs an interline transfer system.

In FIG. 1, reference numeral 1 designates an N-type silicon substrate upon which a light receiving section 4, a vertical register section 5, a horizontal register section (not shown) and an output section (not shown) are formed so as to constitute a so-called interline transfer charge coupled device (CCD) type imager device. On the surface of the N-type silicon substrate 1 there is deposited, e.g. by epitaxitial growth techniques, a P-type region 2. An $N^-$-type region 6 is deposited on the surface of the P-type region 2.

The light receiving section 4 is formed of a shallow $P^{++}$-type region 7 formed in a surface region of the $N^-$-type. region 6 and an $N^+$-type region 3 is formed beneath the $P^{++}$-type region 7 to constitute a signal charge accumulating region. There is also a $P^+$-type region 8 constituting a channel stopper section formed adjacent to the $P^{++}$-type region 7 and the $N^+$-type region 3. An insulating layer 9 made of $SiO_2$ is deposited on the $P^{++}$-type region 7.

The vertical register section 5 is formed such that an $N^+$-type region 11, which constitutes a signal charge transfer region, is formed adjacent to a P-type region 10, which constitutes a read-out gate region. A transfer electrode 13 made of polysilicon and another insulating layer 12 made of $Si_3N_4$ are formed above the $N^+$-type region 11 within the insulating layer 9 made of $SiO_z$. One end portion of the electrode 13 is also used as a read-out gate electrode 13A. A P-type region 14 is formed, for preventing smear, beneath the $N^+$-type region 11 constituting the signal charge transfer region. Further, an aluminum layer 15 for shielding light is deposited above the transfer electrode 13 above the insulating layer 9.

Although only two of the transfer electrodes 13 are illustrated in FIG. 1, there are disposed a predetermined number of transfer electrodes such that the vertical register section 5 is driven by a conventionally known four-phase driving method. The horizontal register section and output section are not illustrated in the drawing, however, they are assumed to be formed as those known in the solid state imager device art.

In the embodiment shown in FIG. 1, the negative voltage terminals of direct current (DC) power supply sources 16 and 17 are commonly connected to the P-type region 2 and then grounded. The positive voltage terminals of the DC power supply sources 16 and 17 are connected to first and second fixed contacts 18A and 18B, respectively, of a switching circuit 18. A movable contact 18C of the switching circuit 18 is connected to the N-type silicon substrate 1.

An output voltage $V_L$ from the DC power supply source 16 is selected to be a value, e.g. 10 volts, such that when the voltage $V_L$ is applied to the N-type silicon substrate 1, the potential in the P-type region 2 becomes slightly lower than the potential of the shallow $P^{++}$-type region 7 on the surface of the region 3, as shown by a solid line designated X in FIG. 2, so that signal charges can be accumulated in the signal charge accumulating region 3 and blooming can be effectively suppressed. An output voltage $V_H$ from the DC power supply source 17 is selected to be a value, for example 30 volts, such that when the voltage $V_H$ is applied to the N-type silicon substrate 1, the potential in the P-type region 2 becomes lower than the potential in the signal charge accumulating region 3, as is shown by a broken line designated Y in FIG. 2, so that the signal charges accumulated in the signal charge accumulating region 3 can be discharged to the N-type silicon substrate 1. Switching in the switching circuit 18 can be controlled by a control signal supplied thereto through a control signal input terminal 19.

Figure 3A:
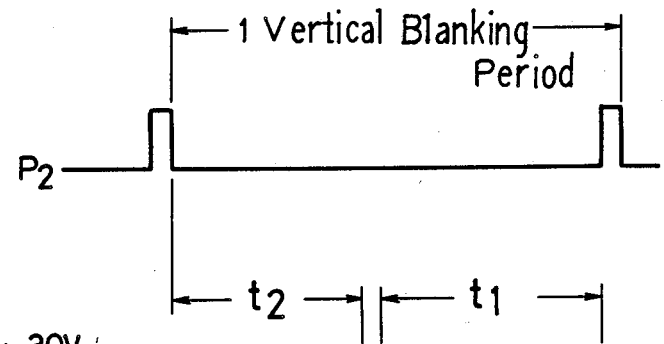
FIGS. 3A and 3B are timing charts for explaining the operation of a shutter function of a solid state imager device according to the present invention.

According to the principles of the instant invention, in a solid state imager device of the present embodiment, when a read-out pulse $P_2$, as shown in FIG. 3A, is supplied to the read-out gate 13A while the output voltage $V_L$ from the DC power supply source 16 is applied to the N-type silicon substrate 1, signal charges accumulated in the signal charge accumulating region 3 are read out to the vertical register section 5. Therefore, in the present embodiment, the read-out pulse $P_2$ is supplied to the read-out gate electrode 13A at every field within the vertical retrace.

Figure 3B:

After the read-out pulse $P_2$ is supplied to the read-out gate electrode 13A, if the switching circuit 18 is controlled so as to supply the N-type silicon substrate 1 with the 30 volts pulse, i.e., supplying a discharging pulse $P_1$ at a desired time within one field period as shown in FIG. 3B, signal charges accumulated in the signal charge accumulating region 3 for a period $t_2$, i.e., a period from the time the proceeding read-out pulse $P_2$ is applied to the read-out gate electrode 13A to the time the current discharging pulse $P_1$ is applied to the N-type silicon substrate 1, are transferred to the N-type silicon substrate 1. Therefore, when the next read-out pulse $P_2$ is supplied to the read-out gate electrode 13A, signal charges accumulated in the signal charge accumulating region 3 for the period $t_1$, i.e., a period from the supply of the proceeding discharging pulse $P_1$ to the supply of the present read-out pulse $P_2$, are read out to the vertical register section 5.

As described above, the exposure time of the solid state imager device of the present embodiment becomes the period $t_1$ so that a desired exposure time can be obtained by selecting the timing of supplying the discharging pulse $P_1$ to the N-type silicon substrate 1. Accordingly, when this solid state imager device is used in a video camera, the video camera does not have to be provided with a mechanical shutter so that it is possible to reduce the size, weight and manufacturing cost of the camera.

Furthermore, for discharing of the signal charges, the present solid state imager device does not have to operate the vertical register section at a high speed as do the conventional solid state imager devices. The present device only requires, for example, a pulse of 30 volts to be applied to the N-type silicon substrate 1 so that the electric power necessary for the exposure control can be largely reduced.

With reference now to FIGS. 1 and 4A through 4E, another method for controlling the exposure time of the solid state imager device will be explained.

Figure 4A:
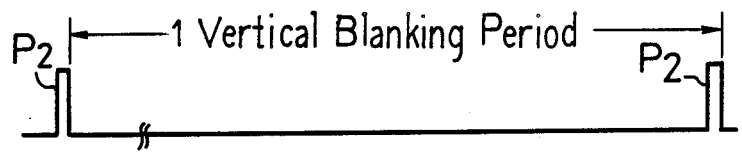
FIGS. 4A through 4E are timing charts for explaining the operation of another shutter function of a solid state imager device according to the present invention.

According to this method, after signal charges accumulated in the signal charge accumulating region 3 for the preceding field period are read out by the read-out pulse $P_2$ shown in FIG. 4A (the same as that shown in FIG. 3A) to the vertical register section 5, the voltage $V_H$ (30 volts) is applied from the power supply source 16 through the switching circuit 18 to the N-type silicon substrate 1 so as to discharge the signal charges accumulated in the signal charge accumulating region 3 in such a manner that an arbitrary number of the horizontal blanking periods, each being set at 63.5 microseconds, are successively selected. During the horizontal blanking periods thus selected, the switching circuit 18 is controlled by the control signal applied thereto from the terminal 19 to connect its movable contact 18C to its second fixed contact 18B. In other words, after the signal charges are read out by the read-out pulse $P_2$, the voltage $V_H$ (30 volts) is applied to the N-type silicon substrate 1 at every horizontal blanking period to discharge the signal charges accumulated in the signal charge accumulating region 3 immediately before the exposure is started. During the exposure time period $t_1$ (FIG. 4B), the voltage $V_L$ (10 volts) is applied from the power supply source 16 through the switching circuit 18 to the N-type silicon substrate 1 to accumulate signal charges in the accumulating region 3. FIG. 4C shows a horizontal clock signal while FIG. 4D shows a horizontal blanking signal and FIG. 4E shows the voltages to be applied to the N-type silicon substrate 1 within the horizontal blanking period.

Figure 4B:
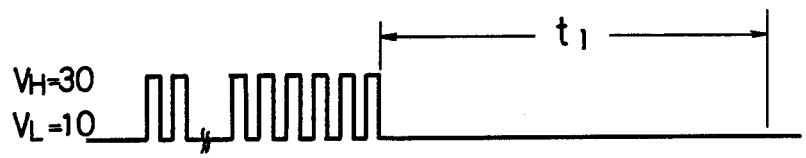
Figure 4C:
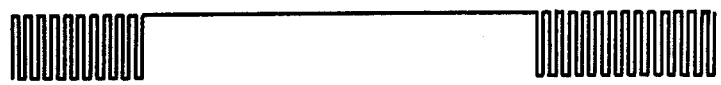
Figure 4D:
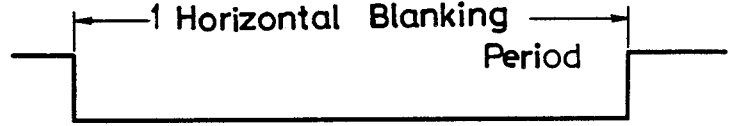
Figure 4E:

According to the method just described, it is possible that the exposure time $t_1$ can be changed in a range between 1/60 and 1/10000 of a second by selecting the number of the horizontal blanking periods for discharging the signal charges accumulated in the signal charge accumulating region 3, as shown in FIG. 4B.

As described above, the exposure time is controlled by changing the voltage applied to the N-type silicon substrate 1. Since the voltage $V_H$ is applied to the N-type silicon substrate 1 within the horizontal blanking period, even though the buffer amplifier and other devices forming the output section are caused to fluctuate by changing the voltage applied to the N-type silicon substrate 1, the reproduced image will never be influenced by the above change so that it is possible to obtain reproduced images with a constant contrast.

The above description has been given with respect to the situation where the signal charges are discharged at every horizontal blanking period immediately before the exposure is started. Apart from that, modifications can be made dependent on the characteristics of a solid state imager device such as where the signal charges are discharged only once within the horizontal blanking period and immediately before the exposure is started or where some of the horizontal blanking periods before the exposure is started are selected to discharge the signal charges. In other words, the number of the discharges can be selected in accordance with the characteristics of each solid state imager device.

Although the above description is given on a single preferred embodiment of the invention, it will be apparent that many modifications and variations may be effected by one skilled in the art without departing from the spirit or scope of the invention. Therefore, the scope of the invention shall be determined by the appended claims only.

We claim:

1. An electronic shutter for a CCD image sensor, comprising:
   a CCD imager device having a semiconductor substrate of a first conductivity type, a region of a second conductivity type formed upon said semiconductor substrate of said first conductivity type, a signal charge accumulating region formed on a surface side of said region of a second conductivity type; and
   means for applying a predetermined voltage to said semiconductor substrate of said first conductivity type within a horizontal blanking period to thereby discharge signal charges accumulated in said signal charge accumulating region to said semiconductor substrate of said first conductivity type within the horizontal blanking period.

2. A method for utilizing a CCD image device as an electronic shutter for an electronic camera comprising the step of applying a voltage potential across a semiconductor substrate of a first conductivity type and a region of a second conductivity type formed upon said semiconductor substrate within a horizontal blanking period to thereby discharge signal charges accumulated in a signal charge accumulating region formed on a surface side of said region of a second conductivity type to said semiconductor substrate within said horizontal blanking period.

* * * * *